US010276341B2

(12) United States Patent
Watanabe et al.

(10) Patent No.: US 10,276,341 B2
(45) Date of Patent: Apr. 30, 2019

(54) CONTROL METHOD AND CONTROL PROGRAM FOR FOCUSED ION BEAM DEVICE

(71) Applicant: Hitachi, Ltd., Chiyoda-ku, Tokyo (JP)

(72) Inventors: Keiji Watanabe, Tokyo (JP); Toshiyuki Mine, Tokyo (JP); Hiroyasu Shichi, Tokyo (JP); Masatoshi Morishita, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/909,601

(22) Filed: Mar. 1, 2018

(65) Prior Publication Data

US 2018/0261423 A1 Sep. 13, 2018

(30) Foreign Application Priority Data

Mar. 10, 2017 (JP) ................. 2017-045681

(51) Int. Cl.
*H01J 37/15* (2006.01)
*H01J 37/30* (2006.01)
*H01J 37/147* (2006.01)
*H01J 37/304* (2006.01)
*H01J 37/305* (2006.01)
*H01J 37/317* (2006.01)
(Continued)

(52) U.S. Cl.
CPC .......... *H01J 37/1471* (2013.01); *H01J 37/15* (2013.01); *H01J 37/3007* (2013.01); *H01J 37/3045* (2013.01); *H01J 37/3056* (2013.01); *H01J 37/3171* (2013.01); *H01J 2237/20285* (2013.01); *H01J 2237/30455* (2013.01); *H01J 2237/30472* (2013.01); *H01J 2237/31735* (2013.01); *H01J 2237/31749* (2013.01)

(58) Field of Classification Search
CPC .... H01J 37/1471; H01J 37/15; H01J 37/3007; H01J 37/3045; H01J 37/3056; H01J 37/3171; H01J 2237/20285; H01J 2237/30455; H01J 2237/30472; H01J 2237/31735; H01J 2237/31749
USPC ..................... 250/396 R, 397, 398, 399, 400
See application file for complete search history.

(56) References Cited

U.S. PATENT DOCUMENTS 9,310,325 B2    4/2016  Nakatani et al.
2008/0042059 A1  2/2008  Tashiro et al.
2014/0291512 A1 10/2014  Nakatani et al.

FOREIGN PATENT DOCUMENTS

JP    2014-209450 A    11/2014
JP    2014-225362 A    12/2014

OTHER PUBLICATIONS

Extended European Search Report issued in counterpart European Application No. 18155951.9 dated Aug. 7, 2018 (12 pages).

*Primary Examiner* — Nicole M Ippolito
*Assistant Examiner* — Hanway Chang
(74) *Attorney, Agent, or Firm* — Crowell & Moring LLP

(57) ABSTRACT

The present invention is directed to a technique for correcting processing positional deviation and processing size deviation during processing by a focused ion beam device. A focused ion beam device control method includes forming a first processed figure on the surface of a specimen through the application of a focused ion beam in a first processing range of vision; determining the position of a next, second processing range of vision based on the outer dimension of the first processed figure; and moving a stage to the position of the second processing range of vision thus determined. Further, the control method includes forming a second processed figure through the application of the focused ion beam in a second processing range of vision.

13 Claims, 17 Drawing Sheets

CONTROL METHOD AND CONTROL PROGRAM FOR FOCUSED ION BEAM DEVICE

CROSS-REFERENCE TO RELATED APPLICATION

The present application claims priority from Japanese Patent Application No. 2017-045681 filed on Mar. 10, 2017, the content of which is hereby incorporated by reference into this application.

BACKGROUND OF THE INVENTION

1. Field of the Invention

The present invention relates to a control method and a control program for a focused ion beam device and, in particular, to a control method and a control program for a focused ion beam device producing a microstructure such as micro electro mechanical systems (MEMS).

2. Description of the Related Art

JP-2014-209450-A discloses a technique according to which a part of the processing region is processed in a specimen image by a focused ion beam (FIB) device, and then a specimen stage is moved by a movement amount, with the remaining processing region being processed while displayed in another specimen image.

SUMMARY OF THE INVENTION

In the above-mentioned FIB device, it is necessary to perform processing on an area in excess of the maximum range of vision of the screen by means of which the processing by the FIB is performed. In such cases, there occurs processing positional deviation and processing size deviation during processing by FIB, and there is a demand for correcting such deviations.

In the technique of JP-2014-209450-A mentioned above, it is possible to correct processing positional deviation even in the case where a processing region in excess of the display range of the specimen image is to be processed. No consideration is taken, however, of processing size deviation.

It is an object of the present invention to provide a technique for correcting processing positional deviation and processing size deviation during processing by an FIB.

The above mentioned and other objects and novel features of the present invention will become apparent from the description in the present specification and the appended drawings.

The description of the outline of the typical invention disclosed in the present application is as follows.

A focused ion beam device control method according to an embodiment includes the steps of: forming a first processed figure on the surface of a specimen through the application of a focused ion beam in a first processing range of vision; determining the position of a next, second processing range of vision based on the outer dimension of the first processed figure; and moving a stage to the position of the second processing range of vision thus determined.

Another focused ion beam device control method according to an embodiment includes the steps of: obtaining a secondary electronic image through the application of a focused ion beam in a predetermined processing range of vision including at least a part of a first processed figure formed on the surface of a specimen through the application of a focused ion beam; measuring end portion coordinates of the first processed figure through integration in a predetermined direction of the luminance of the secondary electronic image; and determining the position where a next, second processed figure is to be formed based on the end portion coordinates of the first processed figure.

A focused ion beam device control program according to an embodiment includes the following steps that are executed by a computer: forming a first processed figure on the surface of a specimen through the application of a focused ion beam in a first processing range of vision; determining the position of a next, second processing range of vision based on the outer dimension of the first processed figure; and moving a stage to the position of the second processing range of vision thus determined.

Briefly speaking, the effect of the typical invention disclosed by the present application is as follows.

According to an embodiment, it is possible to correct processing positional deviation and processing size deviation during processing by an FIB.

DESCRIPTION OF THE PREFERRED EMBODIMENTS

Figure 1:
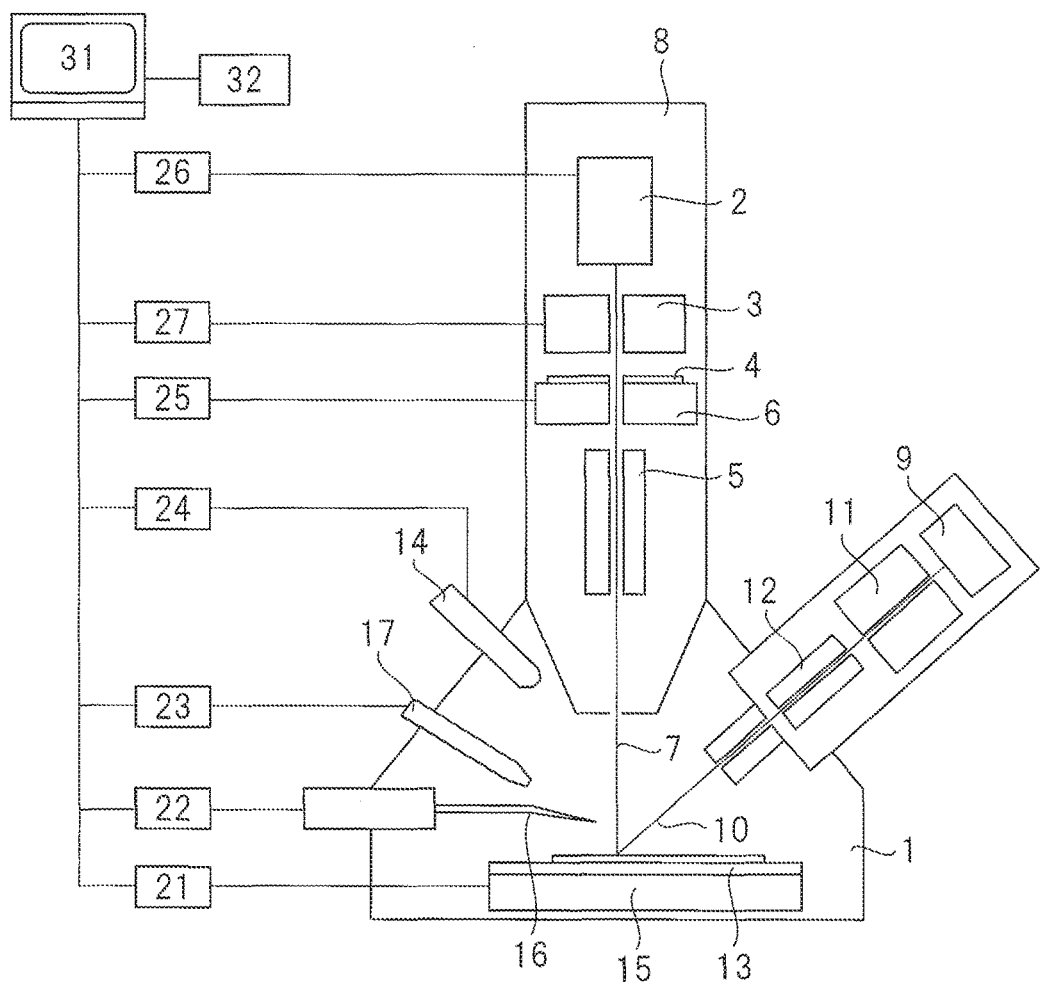
FIG. 1 is a schematic diagram illustrating an example of the construction of a device processing device according to Embodiment 1.

In the following, embodiments will be described in detail with reference to the drawings. In all the drawings for illustrating the embodiments, the same members are indicated by the same reference numerals in principle, and a redundant description thereof will be left out. To facilitate the understanding of the drawings, in some cases, a plan view has a shaded portion, and a shaded portion is omitted in a sectional view.

To facilitate the understanding of the features of the following embodiments, room for an improvement existing in the related-art technique will be first illustrated.

[Room for an Improvement]

Room for an improvement will be described with reference to FIGS. 12 through 19. In the description of this room for an improvement, the material, dimension, etc. in FIB processing are only given by way of example, and they do not restrict the embodiments.

For example, in the production of a microstructure such as MEMS, the development of an MEMS sensor production technique using FIB processing is being progressed. Examples of FIB processing include etching, film formation, and bonding. In the following, etching and film formation will be described.

At present, the maximum range of vision of a screen for performing the processing of the FIB device is, for example, 800 mm×800 mm. At the time of the production of many MEMS sensors, it is necessary to perform a large area processing in excess of this size. The processing of a continuous figure in excess of this maximum range of vision involves the following problems.

Figure 12:
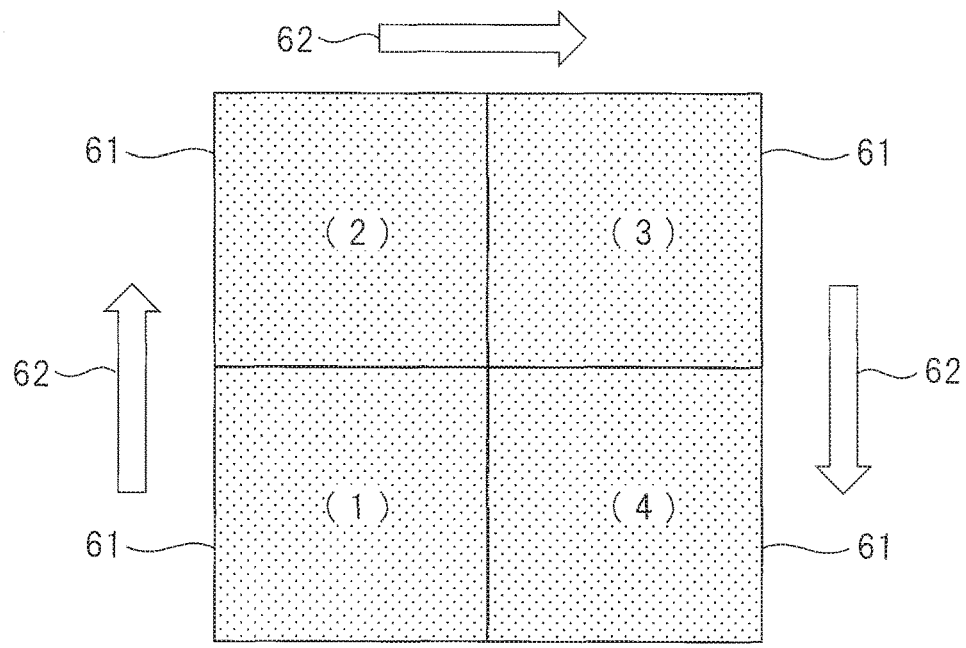
FIG. 12 is an explanatory view illustrating how films of predetermined sizes are successively formed as a stage moves as an example of an experiment of large area film forming in room for an improvement.
Figure 13:
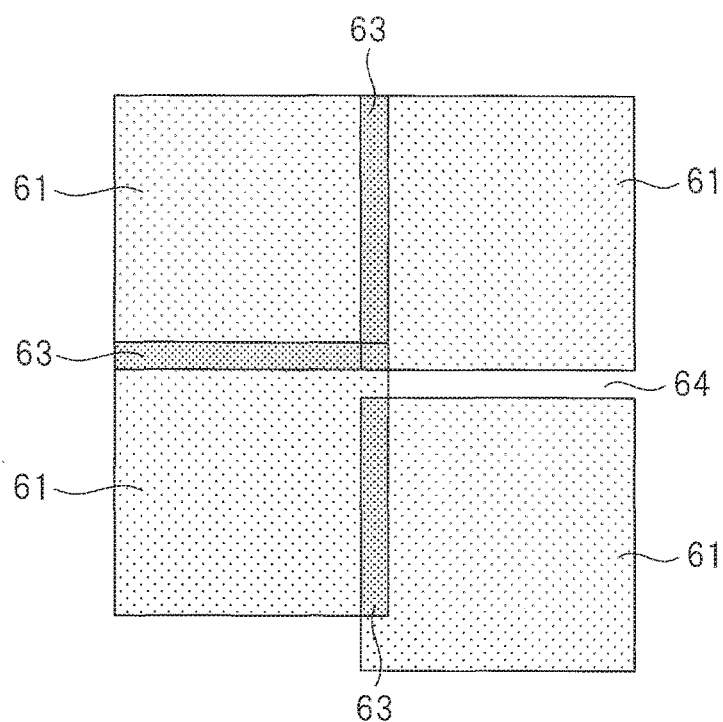
FIG. 13 is an explanatory view of an upper surface SIM image of a film obtained through the example of the experiment of FIG. 12.
Figure 14A:
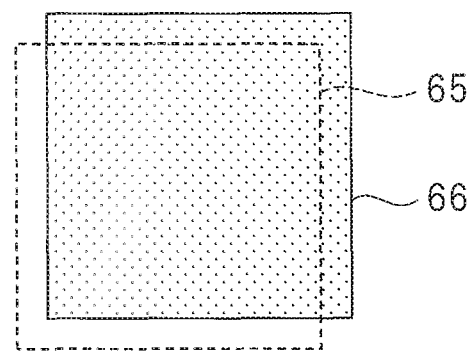
FIGS. 14A and 14B are explanatory views illustrating a factor of deviation from a desired dimension in FIB processing in the room for an improvement.
Figure 14B:
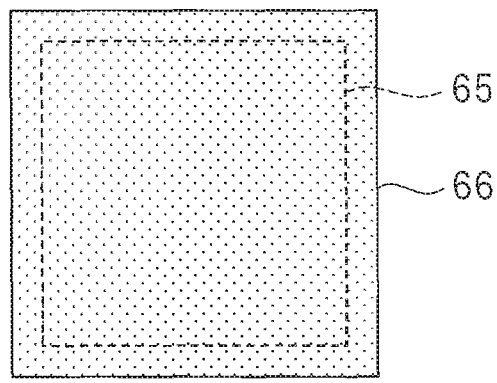

The problems will be described with reference to FIGS. 12 through 14B. FIG. 12 is an explanatory view of an example of large area film formation experiment, in which films of predetermined sizes are successively formed as a stage moves. FIG. 13 is an explanatory view of an upper surface SIM image of a film obtained in the experiment example of FIG. 12. FIGS. 14A and 14B are explanatory views illustrating deviation factors from a desired dimension in FIB processing.

To process a figure in excess of the maximum range of vision, it is necessary to repeatedly execute processing and stage movement. In an example of experiment conducted by the present inventors, there was repeated the formation of films 61 (e.g., SiO$_2$ films) in a predetermined size (e.g., 20 mm×20 mm size) as shown in FIG. 12 in the order: (1)→(2)→(3)→(4) with the movement of the stage 62. As a result, in the upper surface SIM image of the films 61 obtained, there were generated overlapping 63 of the adjacent films 61 and a gap 64 due to deviation in the film forming position as shown in FIG. 13. In FIB processing, this problem includes two factors: processing positional deviation, which is positional deviation of a processing area 66 with respect to a set area 65 as shown in FIG. 14A; and processing size deviation of a processing area 66 with respect to a set area 65 as shown in FIG. 14B.

In the following, these two factors will be discussed.

[Processing Positional Deviation]

Figure 15A:
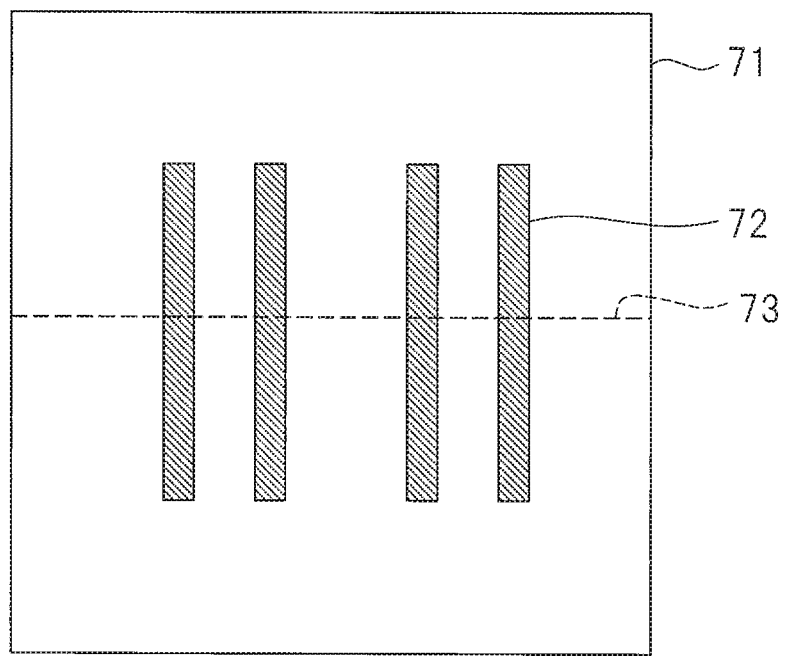
FIGS. 15A and 15B are explanatory views illustrating an example of an SIM image of a groove obtained through processing of a substrate and a luminance profile in the room for an improvement.
Figure 15B:
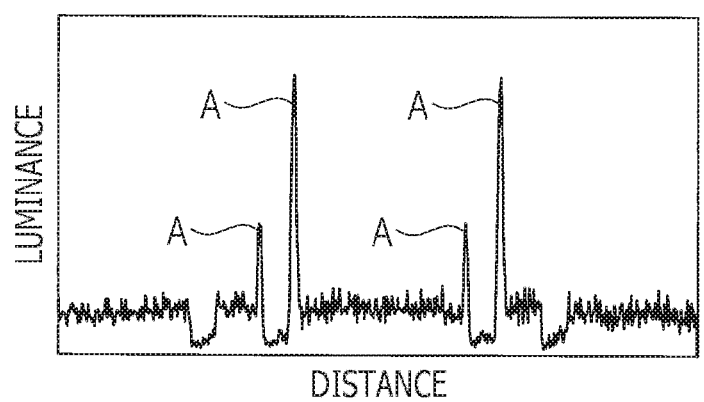
Figure 16:
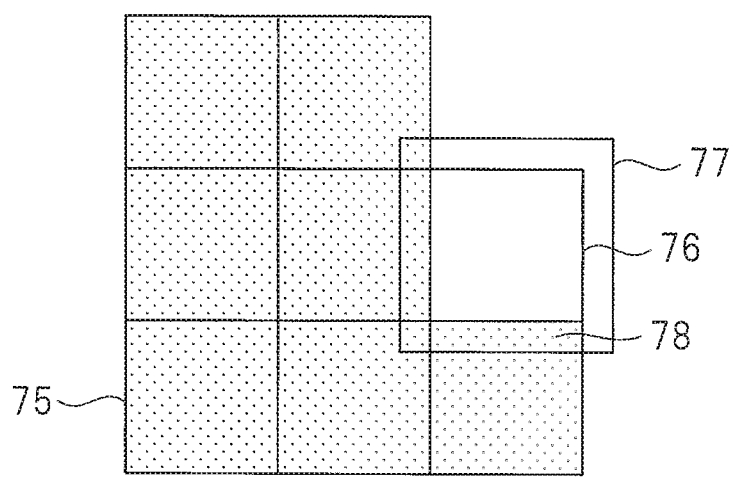
FIG. 16 is an explanatory view illustrating an example of the procedures of large area film formation in the room for an improvement.
Figure 17A:
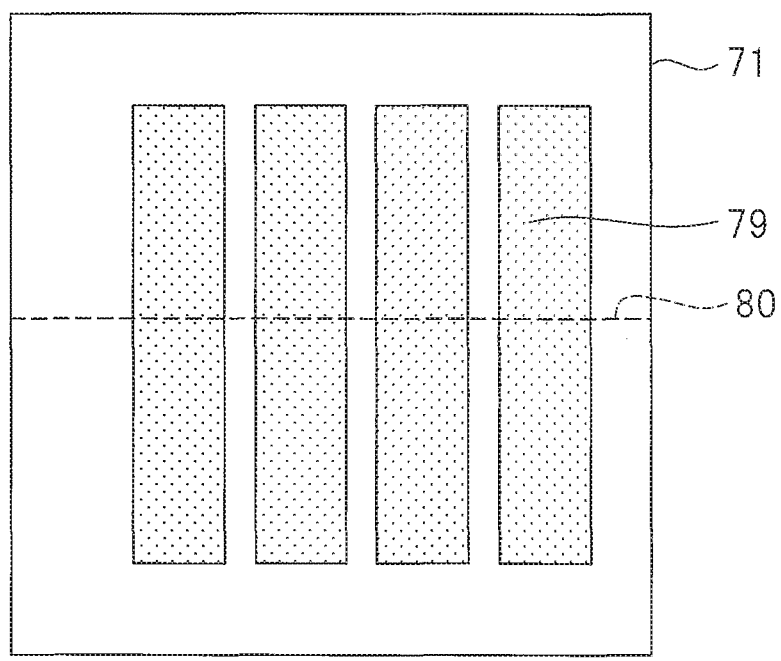
FIGS. 17A and 17B are explanatory views illustrating an example of an SIM image of a film formed by an FIB and a luminance profile.
Figure 17B:
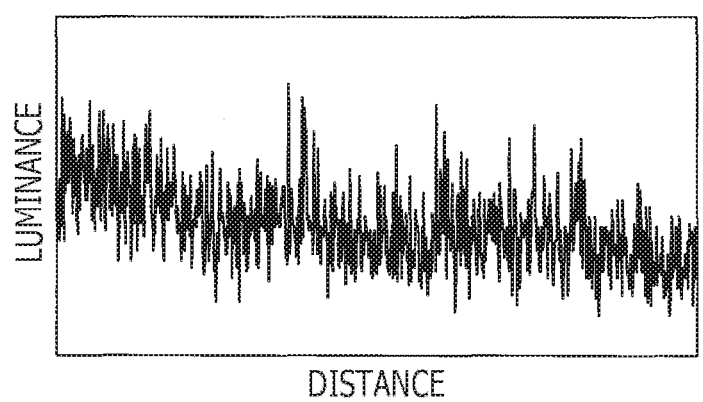

The problem of processing (etching, film formation) positional deviation in the FIB device will be described with reference to FIGS. 15A through 17B. FIGS. 15A and 15B are explanatory views illustrating an example of a groove obtained through processing of a substrate, FIG. 15A showing an SIM image, FIG. 15B showing a luminance profile. FIG. 16 is an explanatory view illustrating an example of the large area film formation procedures. FIGS. 17A and 17B are explanatory views illustrating an example of a film formed by FIB, FIG. 17A showing an SIM image, FIG. 17B showing a luminance profile.

The factors of the processing positional deviation include: (i) accuracy in stage movement, and (ii) a change in the electric field with the vertical movement of the film formation gas gun. The factor (i) is a problem common to etching and film formation, and the factor (ii) is a problem peculiar to film formation. The flow of large area film formation is as follows: stage movement→gas gun lowering (approach to the specimen)→film formation→gas gun raising→stage movement→ . . . , .

To correct the deviations (i) and (ii), in the FIB device currently available, there are taken the measures: "reference pattern image recognition"+"fine adjustment of the beam application position." As the reference pattern, there is often used a cross mark or the like processed in a substrate to a depth of approximately 1 mm. In an example of the experiment conducted by the present inventors, as shown in FIGS. 15A and 15B, SIM observation was performed using a groove 72 formed to a predetermined depth (e.g., a depth of 3.5 mm) in a substrate 71 (e.g., an Si substrate) as a reference pattern. As a result, when the luminance profile of the image is observed at an analysis portion 73 along the dashed line, there appears a portion where the variation is luminance is great (portion A shown in FIG. 15B), whereby it is possible to detect the processed position.

In large area processing, however, there are cases where the processing positional deviation correction method described above cannot be applied. For example, when performing FIB film formation on the entire region of 5 mm×5 mm, etc., there are cases where it is impossible to form the reference pattern (mark) within the region. In this case, as shown in FIG. 16, when newly performing film formation on an area 76 adjacent to a film 75 formed on the substrate 71, it is necessary to perform positioning by using a filmed area 78 in a range of vision 77.

In a film 79 on the substrate 71 formed by FIB, however, the edge, for example, is not steep, so that, as shown in FIGS. 17A and 17B, no portion of great change in luminance appears if the luminance profile of the SIM image is observed at an analysis portion 80 along the dashed line. Thus, in some cases, the edge detection is difficult to perform. If the edge cannot be detected in the luminance profile, the above-mentioned "reference pattern image recognition" is also difficult to perform, so that the correction of the processing position by fine adjustment of the beam application position cannot be effected.

[Processing Size Deviation]

Figure 18:
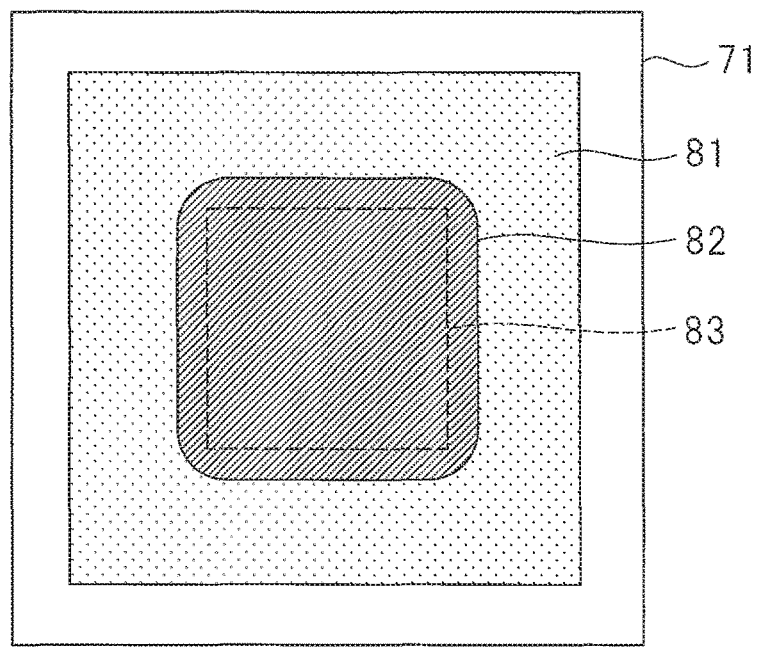
FIG. 18 is an explanatory view illustrating an upper surface SIM image obtained through the processing of a film by a FIB as an example of processing size deviation in the room for an improvement.
Figure 19:
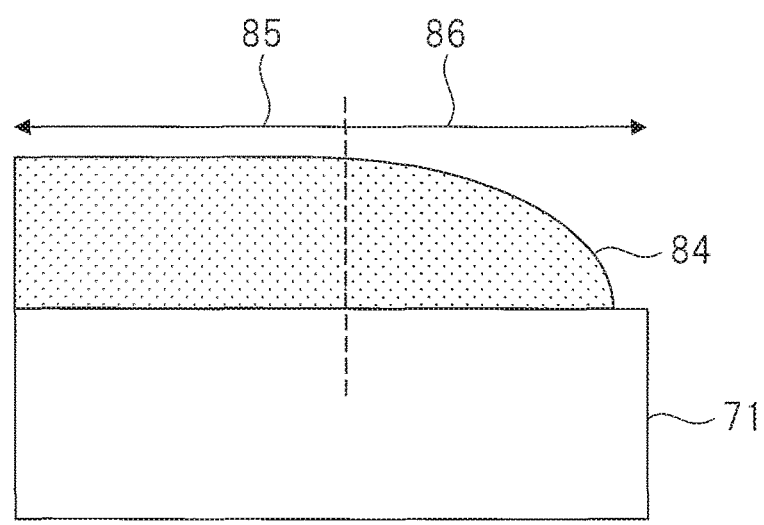
FIG. 19 is an explanatory view illustrating an example of a sectional scanning electron microscope (SEM) image of a film formed by an FIB in the room for an improvement.

Next, the problem of processing (etching, film formation) size deviation will be described with reference to FIGS. 18 and 19. FIG. 18 is an explanatory view illustrating an upper surface SIM image obtained through the processing of a film by a FIB as an example of processing size deviation. FIG. 19 is an explanatory view illustrating an example of a sectional SEM image of a film formed by an FIB.

Even if the above-mentioned problem of processing positional deviation is solved, and a processing frame is set at a predetermined position, there are cases where, as shown in FIG. 18, a film 81 (e.g., C film) on the substrate 71 is processed by FIB, and where the finish size of a hole 82 after this processing differs from the size of a specified set area 83. As shown in FIG. 18, the processing frame indicated by the dashed line is specified as the set area 83, with the result that the hole 82 is formed in a region larger than the specified processing region. This is attributable to FIB beam expansion, drift during processing, etc. If the expansion of the size is previously grasped, the set area 83 of the specified processing frame is to be reduced taking the size expansion into consideration. The expansion of the beam and drift are not always fixed but vary depending on the specimen, so that it is desirable to grasp the size expansion while actually conducting large area processing, feeding it back to the setting of the next, adjacent processing frame in real time.

Further, as shown in FIG. 19, the film 84 formed on the substrate 71 by FIB is uniform in thickness at the central portion 85 of the film 84 but involves generation of sagging at an end portion 86 of the film 84. When performing large area film formation, it is necessary to take the existence of the end portion 86 of the film 84 into consideration, making the film thickness uniform over the entire region including the central portion 85 and the end portion 86 of the film 84.

In view of this, in the present embodiment, a contrivance is made with respect to the room for an improvement existing the above-described related art. In the following, the technical idea in the present embodiment thus contrived will be described with reference to the drawings. The technical idea according to the present embodiment consists in providing a technique for correcting processing positional deviation and processing size deviation during processing by FIB.

Outline of the Embodiment

Figure 9:
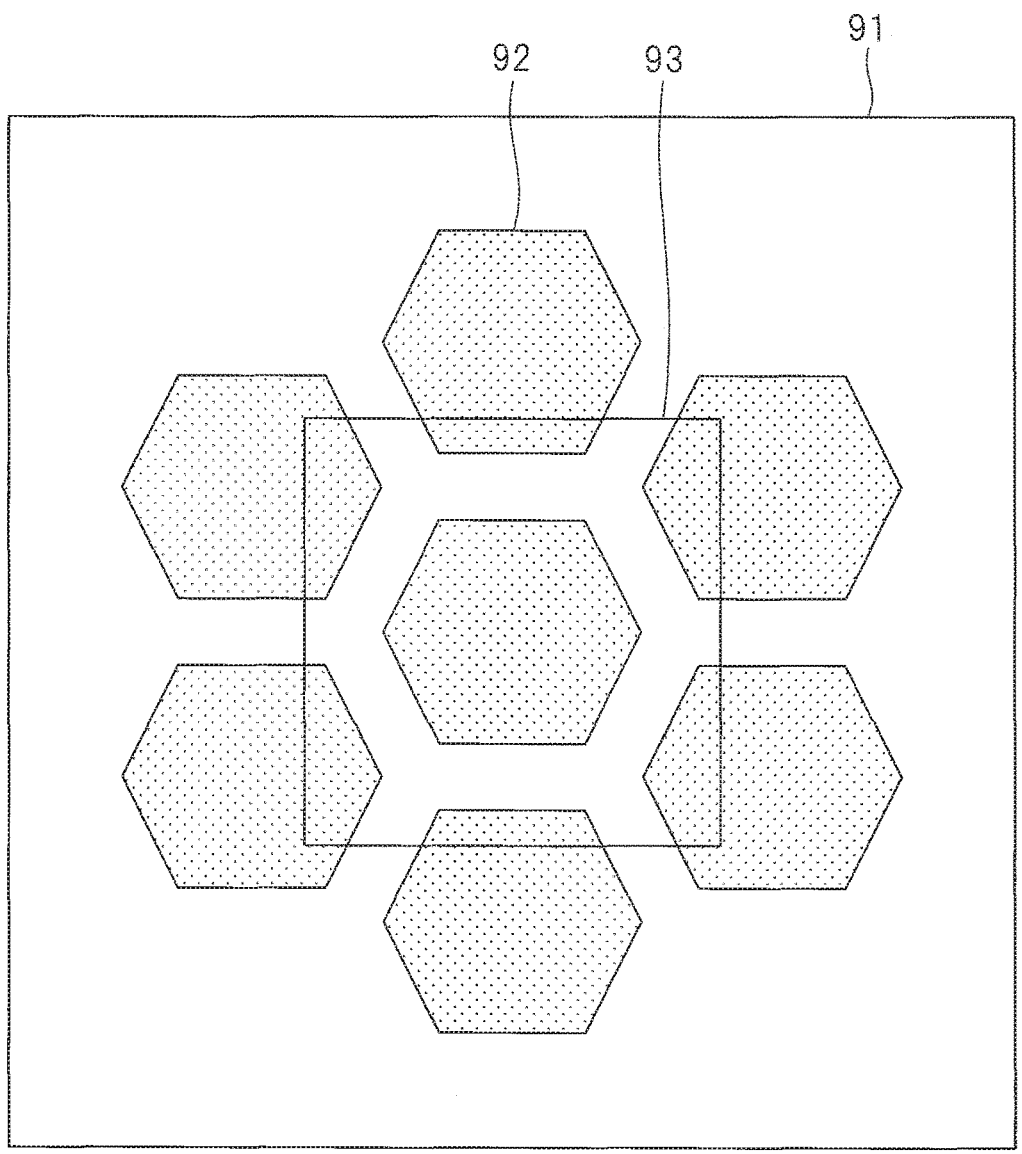
FIG. 9 is an explanatory view illustrating an example of a cycle arrangement pattern in the outline of embodiments.
Figure 10A:
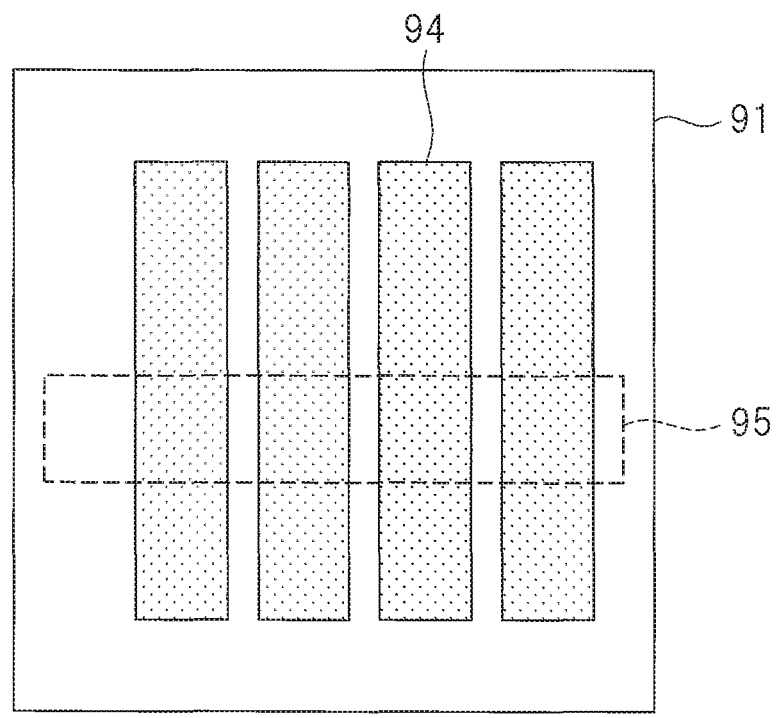
FIGS. 10A and 10B are explanatory views illustrating an example of a scanning ion microscope (SIM) image of a film formed by an FIB and a luminance profile averaged in a rectangular region in the outline of embodiments.
Figure 10B:
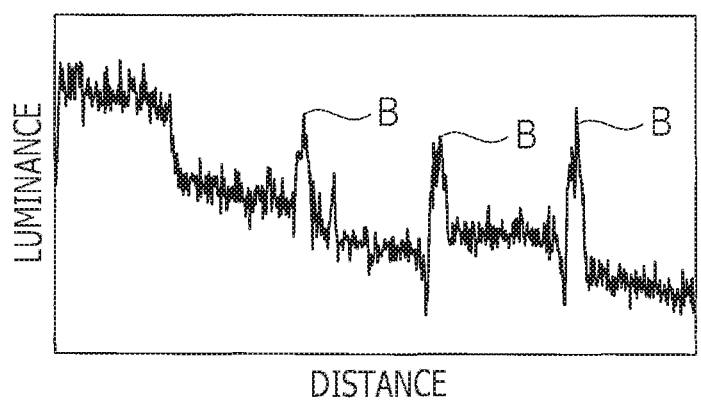
Figure 11A:
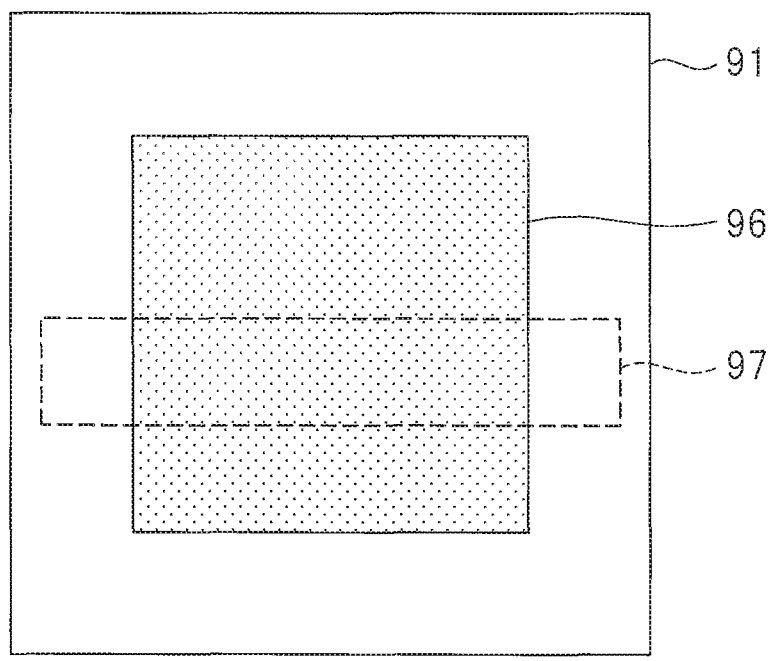
FIGS. 11A and 11B are explanatory views illustrating an example of an SIM image of a film formed by an FIB and a luminance profile averaged in a rectangular region in the outline of embodiments.
Figure 11B:
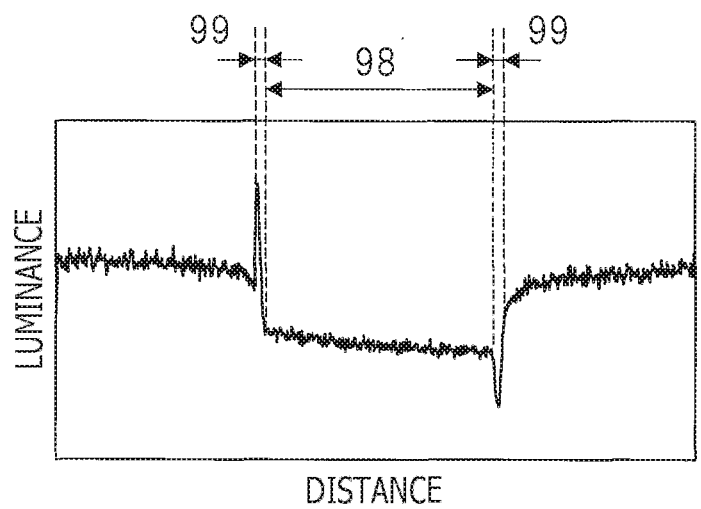

First, the outline of the embodiment will be described with reference to FIGS. 9 through 11B. FIG. 9 is an explanatory view illustrating an example of a cycle arrangement pattern. FIGS. 10A and 10B are explanatory views illustrating an example of an SIM image of a film formed by an FIB and a luminance profile averaged in a rectangular region. FIGS. 11A and 11B are explanatory views illustrating an example of an SIM image of a film formed by an FIB and a luminance profile averaged in a rectangular region.

In the present embodiment, in large area processing by FIB, deviation between the set area and the actually processed area (processing positional deviation and processing size deviation) is corrected. Here, the term "large area" does not always mean an entire region solid fill processing. For example, as shown in FIG. 9, it also includes a cycle arrangement pattern of small area FIG. 92 (hexagons are shown in this example) on the substrate 91. In this case, each of the FIG. 92 arranged in cycle can be processed in one range of vision 93, but the region where the pattern is arranged is large, so that the processing of the total pattern involves stage movement.

As shown in FIGS. 17A and 17B, one of the problems in the prior art technique lies in the fact that the edge of the film cannot detected through the observation of the luminance line profile of the film formed by FIB. In contrast, the present inventors obtained the experimental results as shown in FIGS. 10A and 10B. As shown in FIGS. 10A and 10B, the present inventors have found out that it is possible to distinguish the change in the luminance at the position (position B shown in FIG. 10B) corresponding to the end portion (edge) of the film 94 by computing the profile in the X-direction (the lateral direction in FIG. 10A) obtained through integration of the luminance of the analysis portion 95 of the rectangular region indicated by the dashed line frame for the films 94 (e.g., $SiO_2$ films) formed on the substrate 91 by the same FIB. It has been found out that, in the case of this film 94, when the size in the Y-direction (the vertical direction in FIG. 10B) is, for example, approximately 30 pixels or more, the change in luminance of the end portion of the film 94 becomes clarified in the luminance profile averaged in the rectangular region. Due to this method, it is possible to perform fine adjustment of the processing position, which has been difficult in the prior art.

The pattern image recognition with the FIB device in the present embodiment differs from that in the conventional technique in that when detecting the end portion of the figure constituting the object of recognition, in the case of FIGS. 10A and 10B, it is only necessary to integrate the information in the Y-direction and to measure the luminance profile in the X-direction, thus effecting image recognition based on the information in the integrating direction and the scanning direction.

By employing the integral profile measurement of the rectangular region shown in FIGS. 10A and 10B, it is possible not only to detect the edge of the film but also to cope with the expansion in the processing size and the sagging at the end portion of the film. FIGS. 11A and 11B show an example of the integral profile measurement of the film formed by FIB. As can be seen from FIGS. 11A and 11B, by computing the profile in the X-direction obtained through integration of the luminance of the analysis portion 97 of the rectangular region indicated by the dashed line frame for the films 96 (e.g., $SiO_2$ films) formed by FIB on the substrate 91, the central portion 98 the film thickness of which is substantially uniform and the end portion 99 involving generation of sagging can be detected separately. The sagged region at the end portion 99 is thinner than the central portion 98, so that it is to be assumed that when performing large area film formation, the film thickness can be made uniform over the entire region by performing film formation with the end portions 99 of the adjacent regions overlapping each other.

In the following, embodiments based on the outline of the embodiment described above will be described in detail.

Embodiment 1

Embodiment 1 will be described with reference to FIGS. 1 through 6B. While in Embodiment 1 an MEMS structure (MEMS element) and, in particular, an MEMS sensor will be described as an example of the device, the embodiment is also applicable to other microstructures and other sensors.

[Device Processing Device]

A device processing device according to Embodiment 1 will be described with reference to FIGS. 1 through 3. FIG. 1 is a schematic diagram illustrating the construction of a device processing device according to Embodiment 1.

The device processing device according to the present embodiment has an FIB device shown in FIG. 1. The FIB device has a vacuum container 1, in which there is arranged an ion beam application system composed of an ion source 2 emitting ions, a condenser lens 3, a bear restriction aperture 4, an ion beam scanning polarizer 5, and an aperture rotation mechanism 6. An ion beam 7 is applied from the ion beam application system. The device portion corresponding to the ion beam application system is also referred to as an FIB lens barrel 8.

As the ion source 2, there is employed, for example, a liquid metal ion source or a plasma ion source. The liquid metal ion source emits gallium ions, and a gallium ion beam is applied from the ion beam application system. The plasma ion source emits argon ions or xenon ions, and an argon ion beam or a xenon ion beam is applied from the ion beam application system.

Further, arranged in the FIB device is an electron beam application system composed of an electron gun 9, an electronic lens 11 focusing an electron beam 10 emitted from the electron gun 9, an electron beam scanning polarizer 12, etc. Further, arranged in the FIB device are a specimen 13, a secondary particle detector 14, a specimen stage 15, a probe (manipulator) 16, a gas source 17 introducing a source gas (accumulation gas) at the time of film formation or a gas for promoting the etching at the time of cutting to the vacuum container 1, etc. Here, the specimen 13 is a substrate such as a semiconductor wafer for forming a plurality of MEMS structures (MEMS elements).

In this way, the device processing device according to the present embodiment is equipped with the ion beam application system and the secondary particle detector 14, so that it is possible to use the secondary particle detector 14 for gaining an SIM image. Further, the device processing device according to the present embodiment is also equipped with the electron beam application system, so that it is also possible to use the secondary particle detector 14 for gaining an SEM image.

Further, the device processing device according to the present embodiment has, as devices for controlling the FIB device, a specimen stage control device 21, a manipulator control device 22, a gas source control device 23, a secondary particle detector control device 24, an aperture rotation control mechanism 25, an ion source control device 26, a lens control device 27, a calculation processing device 31, a storage device storing a database 32, etc. The device processing device according to the present embodiment has a computer including the calculation processing device 31, the storage device storing the database 32, etc.

The specimen stage 15 is equipped with a linear movement mechanism for movement in two orthogonal directions in a specimen placing plane, a linear movement mechanism in a direction perpendicular to the specimen placing plane, an in-specimen-placing-plane rotation mechanism, and an inclination mechanism having an inclined shaft in the specimen placing plane, and the control of these mechanisms is conducted by the specimen stage control device 21 in response to a command from the calculation processing device 31.

Further, the calculation processing device 31 is equipped with information input means for inputting information required by the device user, a display for displaying an image generated based on the detection signal of the secondary particle detector 14, information input by the information input means, etc. The information input means includes, for example, a mode input unit 34 shown in FIG. 2 described later. The display displays, for example, a mode selection screen 33 shown in FIG. 2. Further, the calculation processing device 31 realizes a software function unit such as a central control unit 35 shown, for example, in FIG. 2. Further, the database 32 stores, for example, a structure library 32a shown in FIG. 2, computer-aided design (CAD) data 32b, and processing condition data 32c.

In the FIB device, the ions emitted from the ion source 2 are focused on the specimen 13 as an ion beam 7 by a condenser lens 3 and an objective lens. The focusing condition setting is effected through input to the calculation processing device 31. The beam diameter of the ion beam 7 applied to the specimen 13 is determined by the image formation on the specimen 13 using the ion source 2 as the light source, and aberration due to the condenser lens 3, etc. The aberration due to the condenser lens 3, etc. increases when the opening of a beam restricting aperture 4 increases, resulting in an increase in the beam diameter.

Next, the software configuration of the above-described processing device will be described with reference to FIG. 2. FIG. 2 is an explanatory view illustrating an example of the software configuration of the device processing device.

Figure 2:
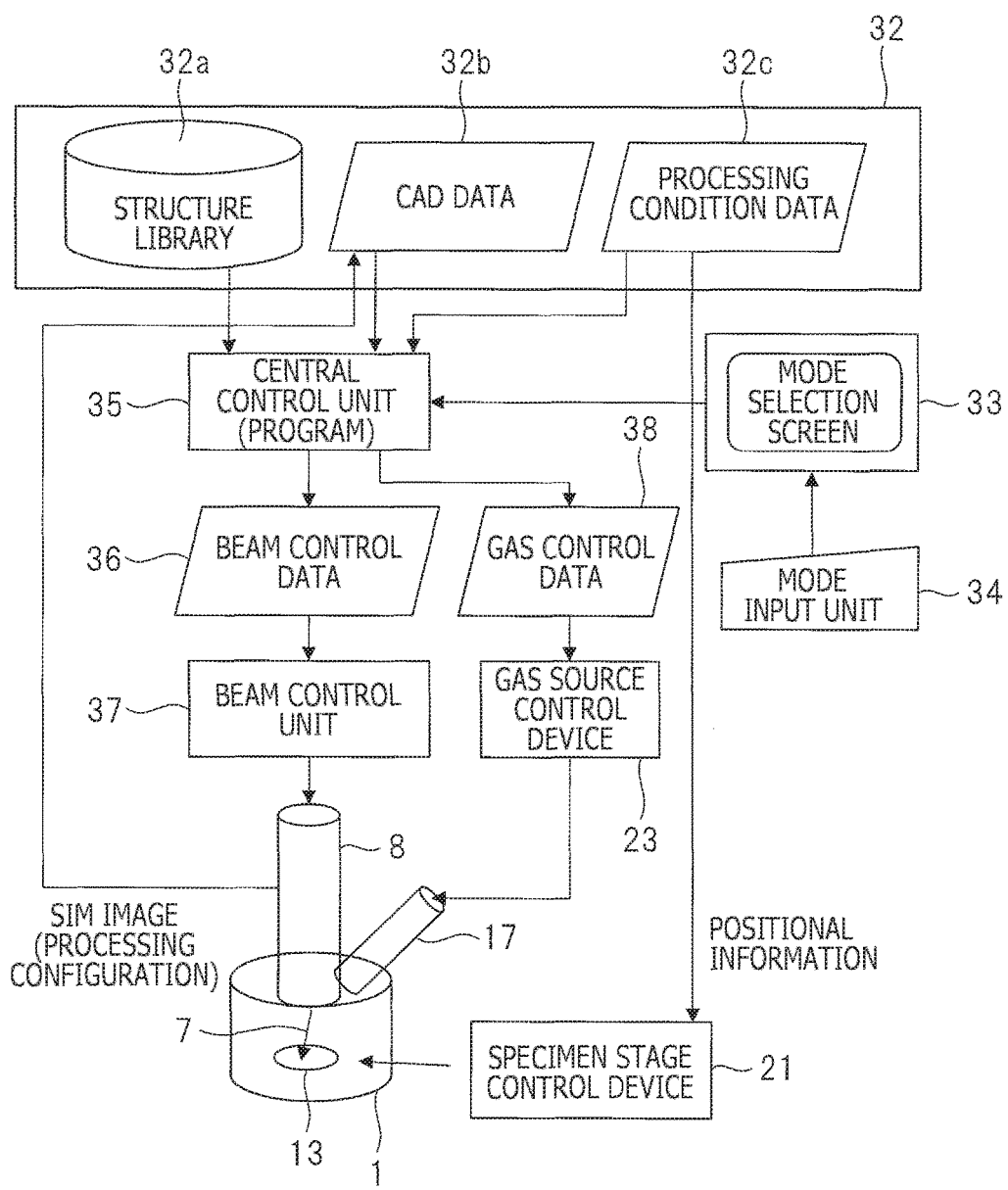
FIG. 2 is an explanatory view illustrating an example of the software configuration of the device processing device of FIG. 1.

As shown in FIG. 2, the FIB device of the device processing device is equipped with the database 32, the mode selection screen 33, a mode input unit 34, the central control unit 35, a beam control unit 37 controlled based on a beam control data 36, a gas source control device 23 performing control based on gas control data 38, a specimen stage control device 21 performing control based on positional information, etc. The beam control unit 37 consists of the aperture rotation control mechanism 25, the ion source control device 26, the lens control device 27, etc. shown in FIG. 1.

To construct the software configuration of the device processing device, the central control unit 35 has a processing control program. This processing control program includes, apart from a program for automatically performing device processing, various programs, for example, one having the function to measure the integration profile of the SIM image taken, and one having the function to feeding the dimensional data obtained through profile measurement back to the stage movement amount or the beam application position.

The database 32 stores various items of data. For example, it stores a structure library 32a, CAD data 32b such as design data on the configuration and dimension of the MEMS structure, and processing condition data 32c such as the processing position and processing condition of the MEMS structure.

For example, in the device processing device, prior to the execution of device processing, the structure library 32a, the CAD data 32b, and the processing condition data 32c are input by the operator from the information input means of the calculation processing device 31 and stored in the database 32.

At the time of device processing, in the mode selection screen 33, the operator selects the device processing method from the mode input unit 34 of the calculation processing device 31. The device processing method includes the device processing method according to the present embodiment (FIGS. 4 through 6B), and the device processing method (FIGS. 7 through 8E) according to Embodiment 2 described below. In the selection of the device processing method, there are performed the registration of the processed figure, the designation of the integrating direction and the scanning direction (FIG. 3) of the luminance profile. The registration of the processed figure includes the unit figure in one range of vision, and the number of times that X and Y are repeated.

Figure 3:
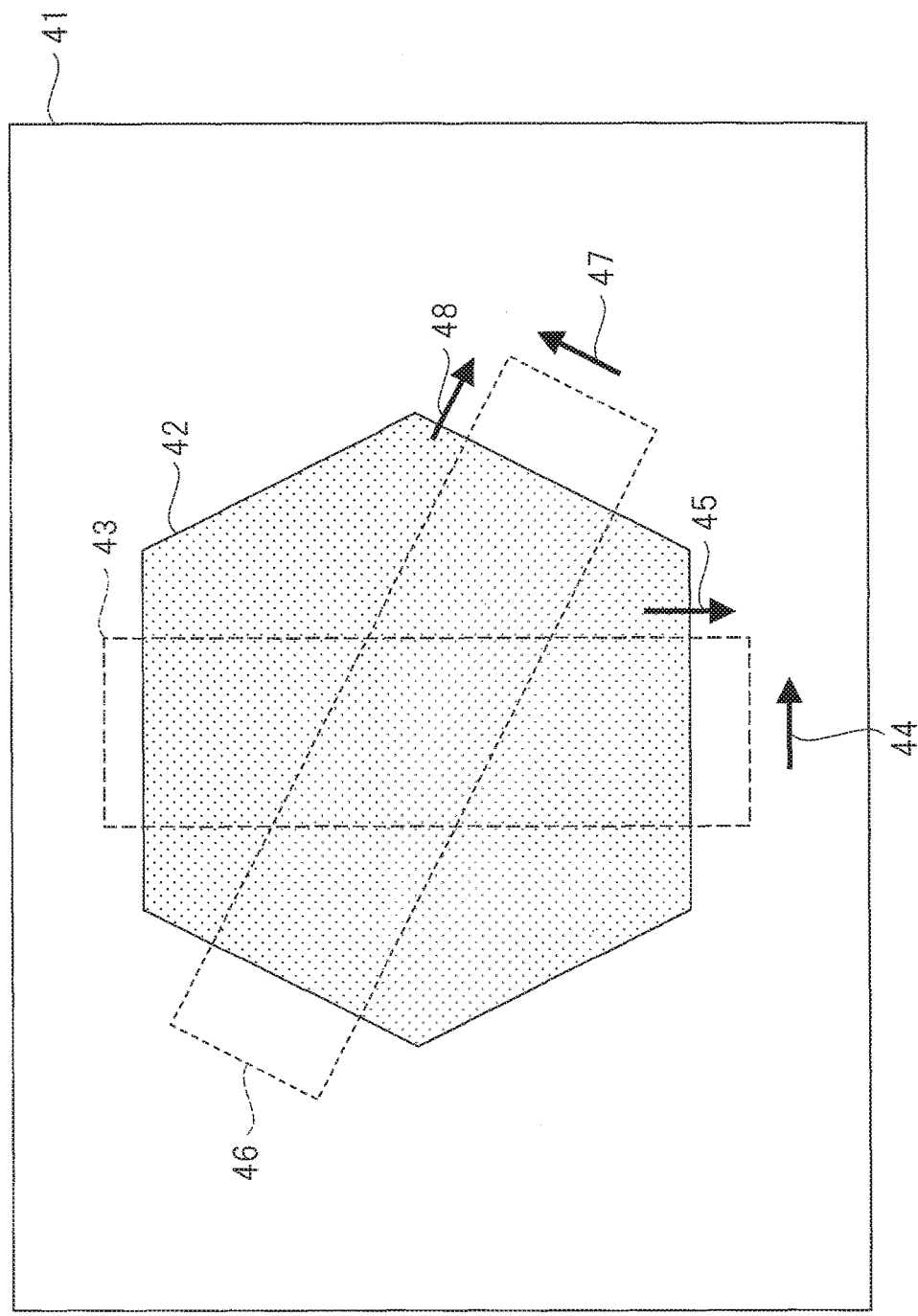
FIG. 3 is an explanatory view illustrating an example of a GUI screen specifying a luminance profile integrating direction and a scanning direction in the device processing device of FIG. 1.

FIG. 3 is an explanatory view of an example of the graphical user interface (GUI) screen by means of which the specification of the integrating direction and the scanning direction of the luminance profile is performed. FIG. 3 shows an example of the GUI screen specifying the integrating direction and scanning direction of the luminance profile with respect to the unit figure processed within one range of vision (which is a hexagon in the example shown). The user specifies the region to be used for the calculation of the luminance profile at the time of image recognition of the edge of the unit figure. In the GUI screen 41 shown in FIG. 3, it is possible to specify the integrating direction 44 and the scanning direction 45 in the luminance profile calculation (1) with respect to the region 43 used for the luminance profile calculation (1) of the unit FIG. 42. Similarly, also with respect to the region 46 used for the luminance profile calculation (2), it is possible to specify the integrating direction 47 and the scanning direction 48 in the luminance profile calculation (2). In this way, it is desirable for a plurality of luminance profile calculation regions to be able to be specified.

Based on the sequence of the device processing method selected in the mode selection screen 33, the central control unit 35 of the calculation processing device 31 refers to the structure library 32a, the CAD data 32b, and the processing condition data 32c in the database 32 to prepare beam control data 36 and gas control data 38.

The beam control data 36 and the gas control data 38 prepared in the central control unit 35 are respectively sent to a beam control unit 37 and a gas source control device 23. In the beam control unit 37, the control of the ion beam application system arranged inside the FIB lens barrel 8 of the FIB device is conducted based on the beam control data 36. Further, in the gas source control device 23, the control of the gas source 17 is performed based on the gas control data 38. At this time, in the specimen stage control device 21, the control of the specimen stage 15 is performed based on the positional information contained in the processing condition data 32c.

Further, at the time of device processing, the processing configuration of the SIM image obtained by the secondary particle detector 14 is stored in the database 32 as CAD data 32b, and, based on this, the calculation of the integral profile is conducted in the central control unit 35, with feedback being performed to the specimen stage control device 21, the beam control unit 37, and the gas source control device 23.

In this way, in the device processing device according to the present embodiment, when the registration of the processed figure and the specification of the integrating direction and scanning direction of the luminance profile are received, the calculation of the integral profile is automatically performed by the calculation processing device 31, and feedback is performed to each control device, whereby it is possible to automatically form the MEMS structure.

[Device Processing Method]

Figure 4:
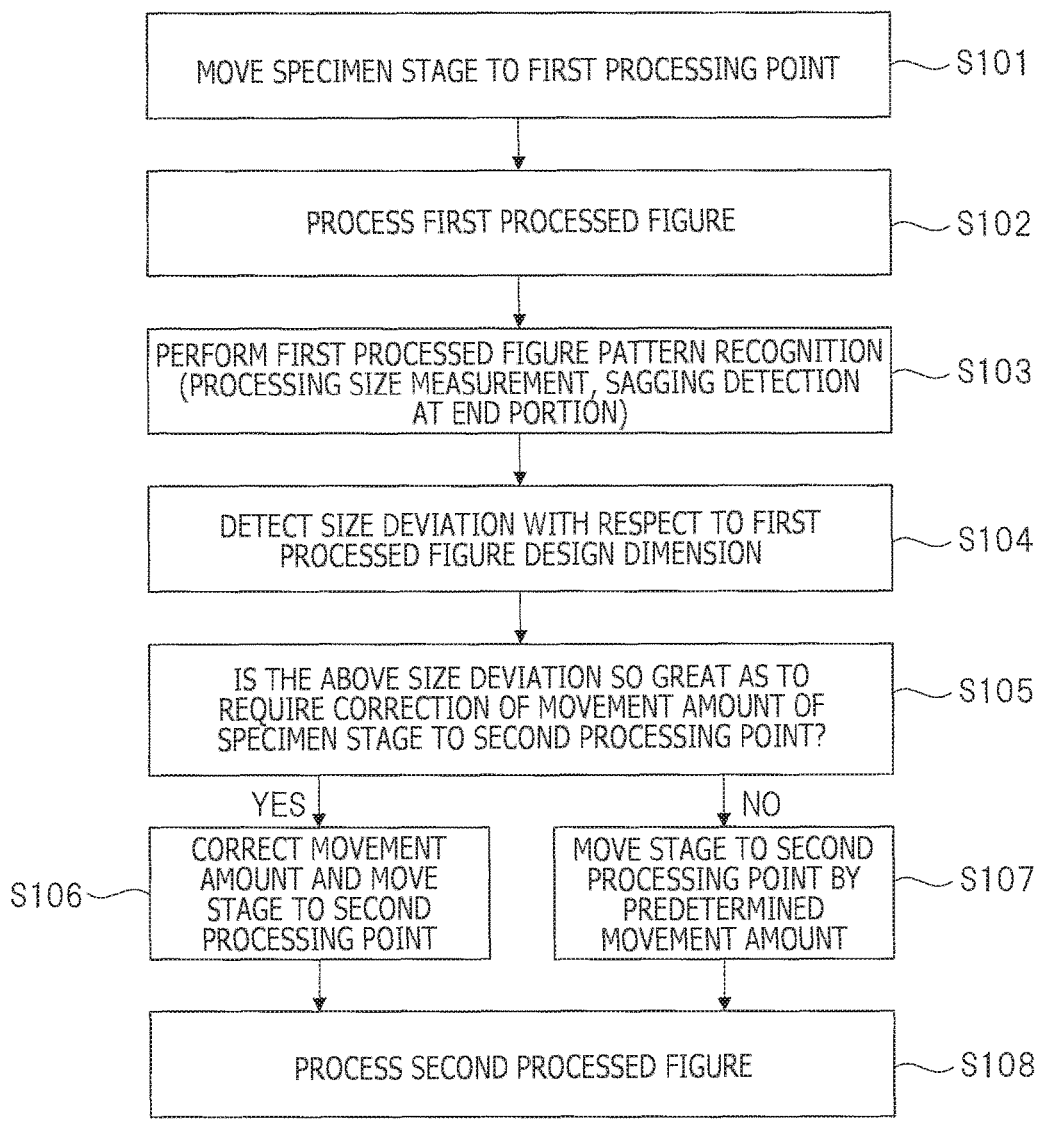
FIG. 4 is a flowchart illustrating an example of the procedures of a device processing method according to Embodiment 1.

The device processing method according to Embodiment 1 will be described with reference to FIGS. 4 through 6B. FIG. 4 is a flowchart illustrating an example of the procedures of the device processing method according to Embodiment 1. FIGS. 5A through 6B are explanatory views showing an example of the processing condition in each step in FIG. 4.

The device processing method according to Embodiment 1 is made possible by executing, in the device processing device having the FIB device described above (FIG. 1), the processing control program composing the software configuration of the device processing device described above (FIG. 2) to realize the FIB device control method.

In the procedures of the device processing method (FIB device control method), as shown in FIG. 4, the FIB device first moves the specimen stage 15 to the first processing point (step S101). Mounted on the specimen stage 15 is the specimen 13 which is the substrate constituting the object of processing.

Next, the FIB device performs the processing of the first processing FIG. 51 (step S102). In this step S102, the first processed FIG. 51 is formed on the surface of the specimen 13 through the application of the ion beam 7 in the first processing range of vision 52. In this step S102, there is employed, for example, the spot beam system or the projection beam system. The spot beam system is a focused beam system in which film formation is performed through the scanning of the specimen 13 with the focused ion beam 7. In the projection beam system, the ion beam 7 of the mask figure configuration is projected onto the specimen 13 by using a formation mask to perform the film formation. The present embodiment is applicable to both film formation systems. When performing this film formation, the ion beam 7 is applied while blowing from the gas source 17 a gas corresponding to the film to be formed. This applies not only to film formation but also to the processing in which etching is performed.

Figure 5A:
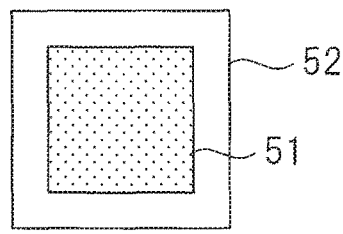
FIGS. 5A through 5D are explanatory views illustrating an example of the processing conditions in the steps of FIG. 4.

For example, as shown in FIG. 5A, in step S102 in which the processing of the first processed FIG. 51 is processed, the first processed FIG. 51 is of a size small enough to be within the size of the first processing range of vision 52. In Embodiment 1, the size of the first processed FIG. 51 is not prescribed with respect to the size of the first processing range of vision 52 at the processing point. Generally speaking, however, in the FIB device, there is generated beam distortion attributable to aberration between the central portion and the end portion of the first processing range of vision 52. Thus, to perform a uniform large area processing, in order that there may be no need to perform processing at the end portion of the first processing range of vision 52, it is effective to make the size of the first processed FIG. 51, for example, 50% or less of the size of the first processing range of vision 52.

Next, the FIB device performs the pattern recognition of the first processed FIG. 51 (step S103). In this step S103, based on the outer dimension of the first processed FIG. 51, the position of the second processing range of vision 54 is determined. In this step S103, the ion beam 7 is applied from the ion source 2, and the SIM image of the secondary electron image detected by the secondary particle detector 14 is taken in the calculation processing device 31 to measure the processing size of the pattern of the first processed FIG. 51 and to detect the sagging of the end portion. Further, it is also possible to display the pattern of the first processed FIG. 51 on the display and observe it.

Figure 5B:
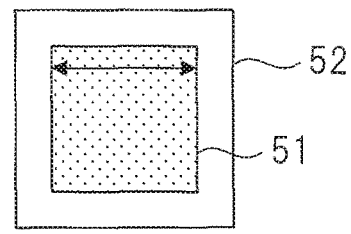

As shown, for example, in FIG. 5B, in this step S103 in which the pattern recognition of the first processed FIG. 51 is conducted, the central portion and the end portion of the film is distinguished from each other in the processing size measurement, and the sizes in the X-direction and the Y-direction are measured. More specifically, as the result of the measurement of the outer dimension of the first processed FIG. 51, the dimension of the first region which is relatively at the central portion of the first processed FIG. 51 and which is of a uniform film formation thickness, and the dimension of the second region which is relatively at the end portion of the first processed FIG. 51 and which is of an uneven film formation thickness are measured. In the case where etching is performed, the depth of the etching is measured instead of the film formation thickness.

Next, the FIB device detects size deviation with respect to the design dimension of the first processed FIG. 51 (step S104). In this step S104, size deviation with respect to the design dimension is detected based on the processing size measured in step S103.

Next, it is determined whether or not the size deviation detected in step S104 is so large as to require correction of the movement amount of the specimen stage 15 to the second processing point (step S105). When, as the result of the determination, the size deviation is large, the movement amount is corrected, and the specimen stage 15 is moved to the second processing point (step S106). On the other hand, when the size deviation is not large, the specimen stage 15 is moved to the second processing point in a predetermined movement amount (step S107). In these steps S106 and S107, the specimen stage 15 is moved to the position of a determined second processing range of vision 54.

Figure 5C:
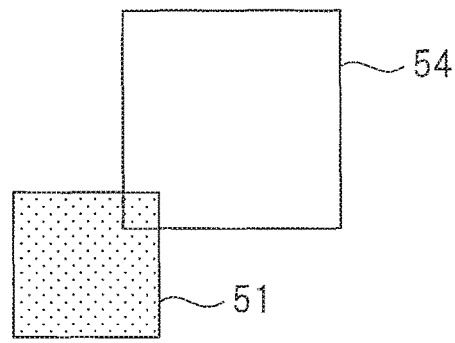
Figure 5D:
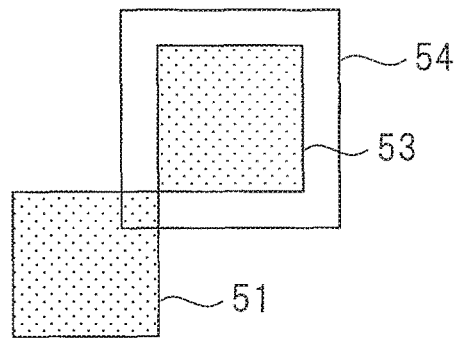

In these steps S106 and S107 in which the specimen stage 15 is moved to the second processing point, as shown, for example, in FIG. 5C, the size of the second processing range of vision 54 is of a size including the corner portions of the first processed FIG. 51. In the example of FIG. 5C, the second range of vision 54 with respect to the first processed FIG. 51 includes the right upper corner portion of the first processed FIG. 51, with the second range of vision 54 moving upwardly to the right.

Then, the FIB device processes a second processed FIG. 53 (step S108). In this step S108, the second processed FIG. 53 is formed through the application of the ion beam 7 in the second range of vision 54. In this step S108, the second processed FIG. 53 is set in position so as to be within the second range of vision 54. As in step S102, at the time of processing, there is employed, for example, the spot beam system or the projection beam system. Also in step S108 in which the second processed FIG. 53 is processed, as shown, for example, in FIG. 5D, the size of the second processed FIG. 53 is of a size which is within the size of the second processing range of vision 54. In Embodiment 1, the first processed FIG. 51 and the second processed FIG. 53 are congruent figures which are of the same configuration and of the same size.

As described above, in the device processing method according to Embodiment 1, the first processed FIG. 51 is processed to detect size deviation with respect to the design dimension of this first processed FIG. 51, and the processing of the second processed FIG. 53 is performed, with the size deviation being reflected in the movement amount of the specimen stage 15 to the second processing point. In the case, however, where the size deviation is small (in the case where even when the movement of the specimen stage 15 is repeated, the processed figure is always within the processing range of vision), there is no need to change the movement amount of the specimen stage 15 to the second processing point at the design stage.

Figure 6A:
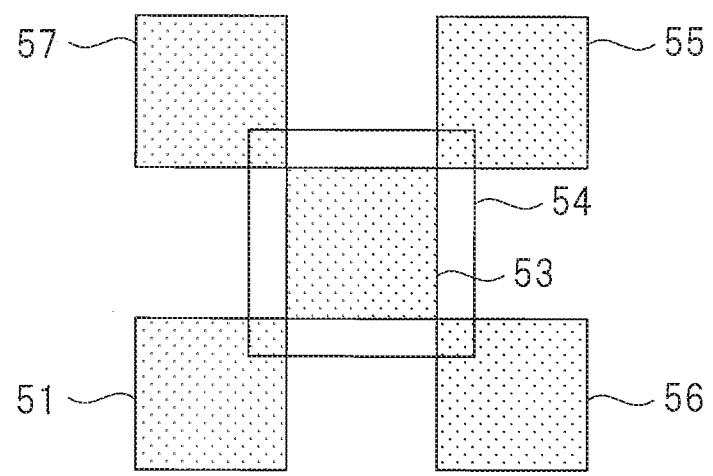
FIGS. 6A and 6B are explanatory views illustrating an example of the processing conditions in the steps of FIG. 4.

In the device processing method according to Embodiment 1, the positional relationship between the first processed FIG. 51 and the second processed FIG. 53 is as shown in FIG. 6. When, as shown in FIG. 6A, both the first processed FIG. 51 and the second processed FIG. 53 are arranged in a checkered pattern, the adjacent spaces are unprocessed in both the X-direction and the Y-direction when performing the size measurement of the second processed FIG. 53 at the time of completion of the second processed FIG. 53, so that it is possible to detect the edge of the second processed FIG. 53, and it is possible to perform size measurement. This applies to other processed FIGS. 55 through 57.

Figure 6B:
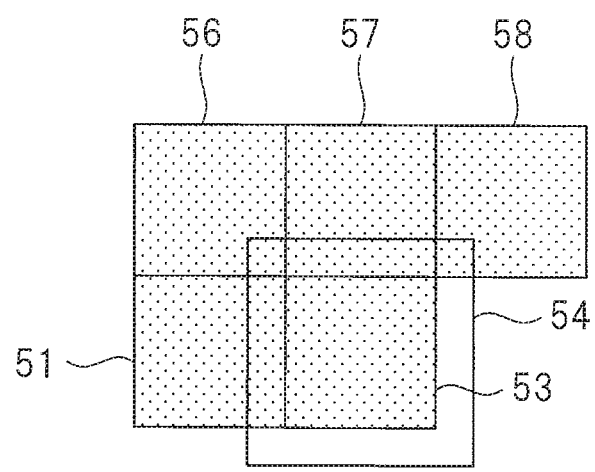

On the other hand, when, as shown in FIG. 6B, the processing of the second processed FIG. 53 is performed in the state in which the adjacent spaces in the X-direction and the Y-direction have already been processed, the size measurement of the second processed FIG. 53 cannot be performed if the boundary between the second processed FIG. 53 and the first processed FIG. 51 cannot be detected. This applies to other processed FIGS. 56 through 58.

Thus, it is advisable for the first processed FIG. 51 and the second processed FIG. 53 to be arranged in a checkered pattern as shown in FIG. 6A. It should be noted, however, that it is in the case where the figure is a square that the checkered pattern is an optimum arrangement pattern. For a triangle, a hexagon, a circle, etc., there can be available other optimum arrangements.

In the example of FIG. 6A, the processing order in the checkered pattern arrangement is, for example, as follows: . . . →the ○th processed FIG. 56→ . . . the first processed FIG. 51→the second processed FIG. 53→the third processed FIG. 55→ . . . the Δth processed FIG. 57→ . . . . The processing point moves obliquely from the left lower side to the right upper side, and then turns back to repeat the movement from the left lower side to the right upper side. In this repeating, the processing point moves from the right to the left. In the case where the processing point is to be moved in an oblique direction, control is performed so as to move the specimen stage 15 on which is the specimen 13 is mounted in an oblique direction.

According to Embodiment 1 described above, it is possible to achieve an improvement in terms of in-plane uniformity (depth uniformity, positional accuracy) in large area processing (etching, film formation) by FIB. The present inventors conducted the film formation experiment shown in FIG. 12. As the result, no such overlapping of adjacent patterns as shown in FIG. 13 and no gaps were generated, making it possible to realize film formation as shown FIG. 12. Thus, it has been found out that the two factors of processing positional deviation as show in FIG. 14A and processing size deviation as shown in FIG. 14B are eliminated and that an improvement in terms of in-plane uniformity has been achieved as compared with the prior art technique.

Embodiment 2

Figure 7:
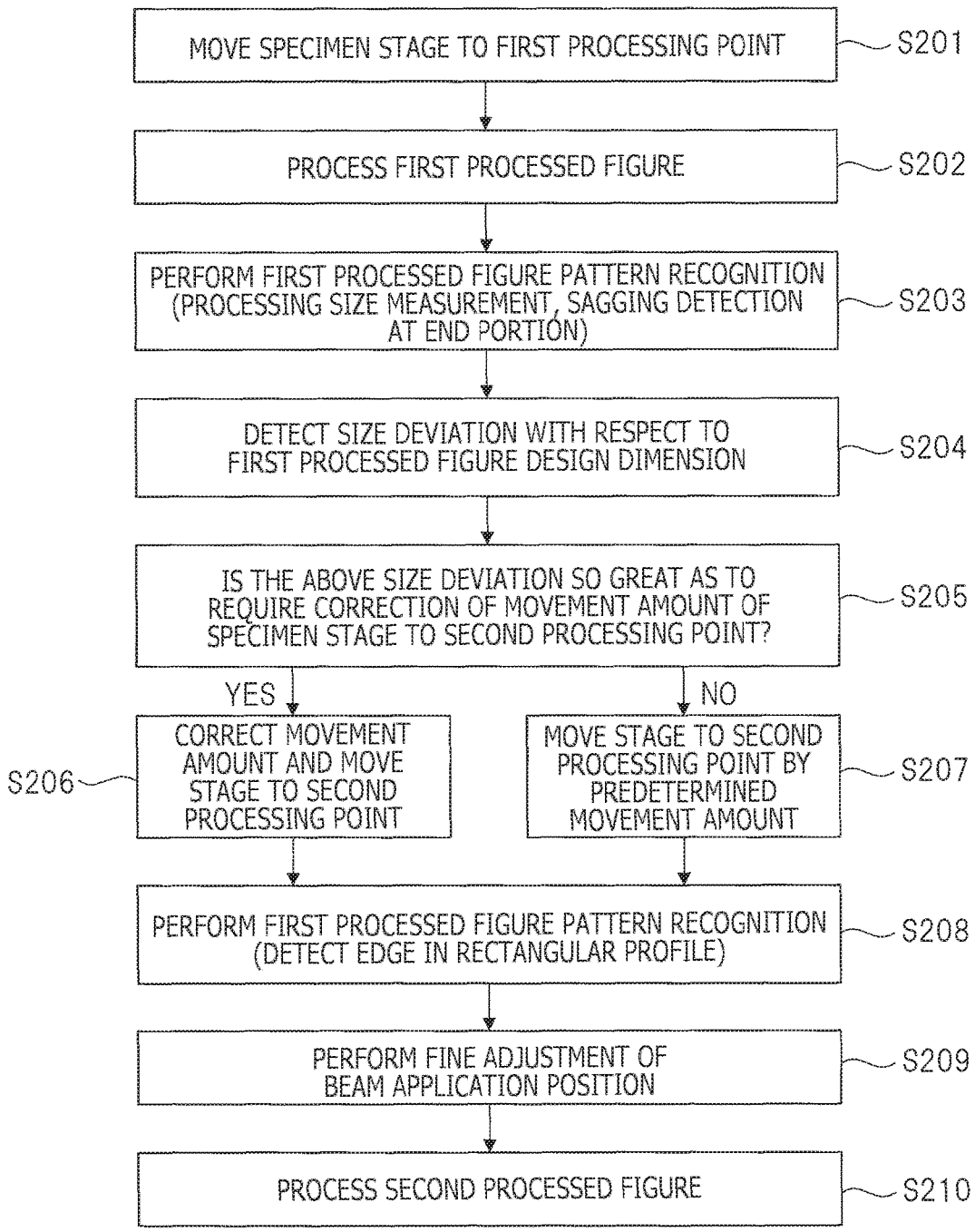
FIG. 7 is a flowchart illustrating an example of a device processing method according to Embodiment 2.

Embodiment 2 will be described with reference to FIGS. 7 through 8E. In the present embodiment, the device processing device is the same as that of Embodiment 1 (FIGS. 1 and 2), so a description thereof will be left out. The description of Embodiment 2 will center on the device processing method, which is different from that of Embodiment 1.

[Device Processing Method]

The device processing method according to Embodiment 2 will be described with reference to FIGS. 7 through 8E. FIG. 7 is a flowchart illustrating an example of the procedures of the device processing method according to Embodiment 2. FIGS. 8A through 8E are explanatory views illustrating an example of the processing condition in each step.

In the procedures of the device processing method (FIB device control method) according to Embodiment 2, the steps S201 through S207 are the same as the steps S101 through S107 of Embodiment 1, so a description thereof will be left out. Further, FIGS. 8A through 8C and 8E are the same as FIGS. 5A through 5D.

After the completion of steps S206 and S207, the FIB device conducts the pattern recognition of the first processed FIG. 51 (step S208). In this step S208, a secondary electronic image is gained through the application of the ion beam 7 in a predetermined second processing range of vision 54 including at least a part of the first processed FIG. 51 formed on the surface of the specimen 13 through the application of the ion beam 7, and, by integrating the luminance of this secondary electronic image in a predetermined direction, the end portion (edge) coordinates of the first processed FIG. 51 are measured. In this step S208, the ion beam 7 is applied from the ion source 2, and the SIM image of the secondary electronic image detected by the secondary particle detector 14 is taken in the calculation processing device 31 to perform edge detection in a rectangular profile. The edge detection in the rectangular profile is performed as described above with reference to FIGS. 3, 10, and 11.

Figure 8A:
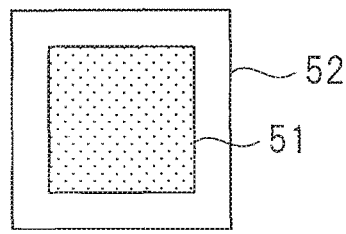
FIGS. 8A through 8E are explanatory views illustrating an example of the processing conditions in the steps of FIG. 7.
Figure 8B:
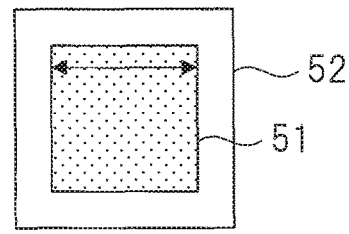
Figure 8C:
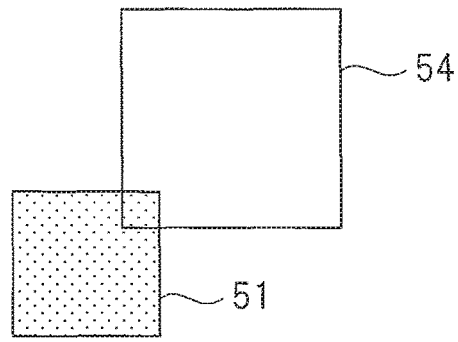
Figure 8D:
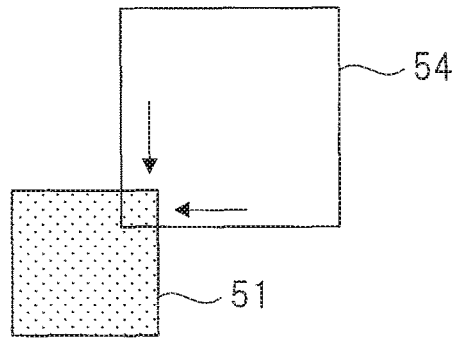
Figure 8E:
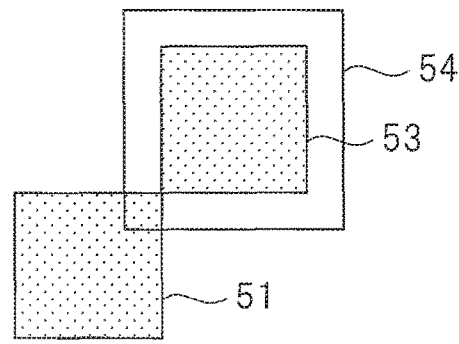

In step S208 in which the pattern recognition of the first processed FIG. 51 is conducted, for example as shown in FIG. 8D, the edge in the X-direction and the Y-direction at the right upper corner portion of the first processed FIG. 51 is detected. In this way, to detect the edge of the first processed FIG. 51, the X-direction and the Y-direction at the right upper corner portion of the first processed FIG. 51 are useful.

Next, the FIB device performs fine adjustment of the beam application position (step S209). In this step S209, based on the edge coordinates of the first processed FIG. 51, the position where the next, second processed FIG. 53 is to be formed is determined. The control of the position where the second processed FIG. 53 is formed is performed through electrical control in the beam control unit 37 of the beam optical system. In this step S209, based on the edge detected in step S208, fine adjustment of the application position of the ion beam 7 applied from the ion source 2 is performed.

Then, the FIB device processes the second processed FIG. 53 (step S210). In this step S210, the second processed FIG. 53 is formed through the application of the ion beam 7 in the second processing range of vision 54. The step is the same as step S108 in Embodiment 1.

As described above, in the device processing method according to Embodiment 2, the first processed FIG. 51 is processed, and size deviation with respect to the design dimension of the first processed FIG. 51 is detected. It is reflected in the movement amount of the specimen stage 15 to the second processing point, and, further, the edge is detected in the rectangular profile. It is reflected in the fine adjustment of the ion beam 7, and the processing of the second processed FIG. 53 is performed.

As in the above Embodiment 1, also in Embodiment 2 described above, it is possible to achieve an improvement in terms of in-plane uniformity (depth uniformity, positional accuracy) in large area processing (etching, film formation) by FIB. In particular, as compared with Embodiment 1, in which no beam application positional adjustment is performed, in Embodiment 2, it is possible to achieve a further improvement in terms of in-plane uniformity.

The invention made by the present inventors has been specifically described based on embodiments. The present invention, however, is not restricted to the above embodiments but naturally allows various modifications without departing from the scope of the gist of the invention.

For example, while in the embodiments described above the device consists of a MEMS structure (MEMS element), the present invention is also applicable to other microstructure, etc. Further, while in the above description the MEMS structure consists of a MEMS sensor, the present invention is also applicable to other sensors, etc.

The present invention is not restricted to the above-described embodiments but includes various modifications. For example, while the above embodiments have been described in detail in order to facilitate the understanding of the present invention, the present invention is not always restricted to a construction equipped with all the components described above.

Further, a part of an embodiment may be replaced by the construction of some other embodiment. Further, it is also possible to add, to the construction of an embodiment, the construction of some other embodiment. Further, addition, deletion, or replacement of another construction is possible with respect to a part of the construction of each embodiment.

What is claimed is:

1. A focused ion beam device control method comprising the steps of:
    forming a first processed figure on a surface of a specimen through application of a focused ion beam in a first processing range of vision;
    determining a position of a next, second processing range of vision based on an outer dimension of the first processed figure; and
    moving a stage to the position of the second processing range of vision thus determined.

2. The focused ion beam device control method according to claim 1, wherein the outer dimension of the first processed figure is measured by a secondary electron image obtained through application of the focused ion beam.

3. The focused ion beam device control method according to claim 2, wherein, as a result of the measurement of the outer dimension of the first processed figure, there are each measured a first region which is relatively at a central portion of the first processed figure and which is of a uniform etching depth or film formation thickness and a second region which is relatively at an end portion of the first processed figure and which is of an uneven etching depth or film formation thickness.

4. The focused ion beam device control method according to claim 1, further comprising the step of forming a second processed figure through application of the focused ion beam in the second processing range of vision.

5. The focused ion beam device control method according to claim 4, wherein the first processed figure and the second processed figure are congruent with each other.

6. The focused ion beam device control method according to claim 4, wherein the first processed figure and the second processed figure are arranged in a checkered pattern.

7. The focused ion beam device control method according to claim 1, wherein the application of the focused ion beam is effected by a projection beam system using a formation mask.

8. A focused ion beam device control method comprising the steps of:
    obtaining a secondary electronic image through application of a focused ion beam in a predetermined processing range of vision including at least a part of a first processed figure formed on a surface of a specimen through application of a focused ion beam;

measuring end portion coordinates of the first processed figure through integration in a predetermined direction of luminance of the secondary electronic image; and determining a position where a next, second processed figure is to be formed based on the end portion coordinates of the first processed figure.

9. The focused ion beam device control method according to claim 8, wherein a control of the position where the second processed figure is formed is effected through electrical control of a beam optical system.

10. The focused ion beam device control method according to claim 8, further comprising the step of forming the second processed figure through application of the focused ion beam in the second processing range of vision.

11. A focused ion beam device control program causing a computer to execute the steps of:

forming a first processed figure on the surface of a specimen through application of a focused ion beam in a first processing range of vision;

determining a position of a next, second processing range of vision based on an outer dimension of the first processed figure; and moving a stage to the position of the second processing range of vision thus determined.

12. The focused ion beam device control program according to claim 11, wherein the computer is further caused to execute the step of forming a second processed figure through application of the focused ion beam in the second processing range of vision.

13. The focused ion beam device control program according to claim 12, wherein the step of forming the second processed figure includes the steps of:

obtaining a secondary electronic image through application of the focused ion beam in a predetermined processing range of vision including at least a part of the first processed figure;

measuring end portion coordinates of the first processed figure through integration in a predetermined direction of the luminance of the secondary electronic image; and determining the position where a next, second processed figure is to be formed based on the end portion coordinates of the first processed figure.

* * * * *